(12) United States Patent
Yan et al.

(10) Patent No.: US 11,996,322 B2
(45) Date of Patent: *May 28, 2024

(54) METHOD FOR FORMING LEAD WIRES IN HYBRID-BONDED SEMICONDUCTOR DEVICES

(71) Applicant: Yangtze Memory Technologies Co., Ltd., Hubei (CN)

(72) Inventors: Meng Yan, Hubei (CN); Jifeng Zhu, Hubei (CN); Si Ping Hu, Hubei (CN)

(73) Assignee: Yangtze Memory Technologies Co., Ltd., Hubei (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/736,026

(22) Filed: May 3, 2022

(65) Prior Publication Data

US 2022/0270919 A1 Aug. 25, 2022

Related U.S. Application Data

(60) Continuation of application No. 17/009,452, filed on Sep. 1, 2020, now Pat. No. 11,322,392, which is a
(Continued)

(30) Foreign Application Priority Data

Aug. 24, 2017 (CN) .......................... 201710732727.2

(51) Int. Cl.
*H01L 21/768* (2006.01)
*H01L 21/02* (2006.01)
(Continued)

(52) U.S. Cl.
CPC .. *H01L 21/76802* (2013.01); *H01L 21/02164* (2013.01); *H01L 21/0217* (2013.01);
(Continued)

(58) Field of Classification Search
None
See application file for complete search history.

(56) References Cited

U.S. PATENT DOCUMENTS

| | | | |
|---|---|---|---|
| 4,594,769 A | * | 6/1986 | Ellwanger ......... H01L 21/31055 257/E21.252 |
| 6,244,811 B1 | | 6/2001 | Kroeker et al. |

(Continued)

FOREIGN PATENT DOCUMENTS

| | | |
|---|---|---|
| CN | 1409867 A | 4/2003 |
| CN | 1505139 A | 6/2004 |

(Continued)

OTHER PUBLICATIONS

International Search Report and Written Opinion of the International Searching Authority directed to related International Patent Application No. PCT/CN2018/098508, mailed on Nov. 2, 2018, 7 pages.

*Primary Examiner* — Alexander G Ghyka
(74) *Attorney, Agent, or Firm* — Sterne, Kessler, Goldstein & Fox P.L.L.C.

(57) ABSTRACT

Embodiments of a hybrid-bonded semiconductor structure are disclosed. The semiconductor structure comprises a first conductive structure and a second conductive structure in a base dielectric layer. The base dielectric layer has a non-flat top surface. A first top surface of the first conductive structure is non-coplanar with a second top surface of the second conductive structure. The semiconductor structure further comprises an alternating dielectric layer stack comprising a plurality of dielectric layers sequentially disposed on the base dielectric layer, wherein at least two of the plurality of dielectric layers have non-uniform thickness. The semiconductor structure further comprises a first lead wire and a second lead wire formed in the alternating
(Continued)

dielectric layer stack and electrically connected to the first conductive structure and the second conductive structure, respectively.

20 Claims, 12 Drawing Sheets

Related U.S. Application Data division of application No. 16/126,935, filed on Sep. 10, 2018, now Pat. No. 10,763,158, which is a continuation of application No. PCT/CN2018/098508, filed on Aug. 3, 2018.

(51) Int. Cl.
    *H01L 21/3105*    (2006.01)
    *H01L 21/311*     (2006.01)
    *H01L 23/522*     (2006.01)
    *H01L 23/528*     (2006.01)
    *H01L 23/532*     (2006.01)

(52) U.S. Cl.
    CPC .. *H01L 21/02271* (2013.01); *H01L 21/31051* (2013.01); *H01L 21/31111* (2013.01); *H01L 21/7684* (2013.01); *H01L 21/76877* (2013.01); *H01L 23/5226* (2013.01); *H01L 23/5283* (2013.01); *H01L 23/53228* (2013.01); *H01L 23/53295* (2013.01); *H01L 21/31116* (2013.01)

(56) References Cited

U.S. PATENT DOCUMENTS

| | | | |
|---|---|---|---|
| 7,138,717 B2 | 11/2006 | Wang et al. | |
| 9,570,463 B1 | 2/2017 | Zhang et al. | |
| 10,763,158 B2 | 9/2020 | Yan et al. | |
| 11,322,392 B2 * | 5/2022 | Yan | H01L 21/02271 |
| 2003/0024902 A1 | 2/2003 | Li et al. | |
| 2003/0190829 A1 | 10/2003 | Brennan | |
| 2003/0216052 A1 | 11/2003 | Kakamu | |
| 2004/0061233 A1 * | 4/2004 | Matsubara | H01L 23/53295 |
| | | | 257/E21.579 |
| 2005/0191850 A1 | 9/2005 | Soda | |
| 2006/0175293 A1 | 8/2006 | Tachibana et al. | |
| 2006/0208361 A1 | 9/2006 | Ohto et al. | |
| 2007/0082479 A1 | 4/2007 | Padhi et al. | |
| 2007/0123035 A1 | 5/2007 | Sugimoto et al. | |
| 2007/0236148 A1 | 10/2007 | Yamazawa et al. | |
| 2008/0081462 A1 | 4/2008 | Choi | |
| 2009/0020744 A1 | 1/2009 | Mizukami et al. | |
| 2009/0068835 A1 | 3/2009 | La Tulipe, Jr et al. | |
| 2013/0072027 A1 | 3/2013 | Ota et al. | |
| 2014/0048885 A1 | 2/2014 | Nakamura et al. | |
| 2015/0041963 A1 * | 2/2015 | Schulze | H01L 29/402 |
| | | | 257/632 |
| 2016/0315046 A1 * | 10/2016 | Jezewski | H01L 23/5222 |
| 2018/0204728 A1 | 7/2018 | Oomori et al. | |
| 2019/0088535 A1 | 3/2019 | Yan et al. | |
| 2020/0402841 A1 | 12/2020 | Yan et al. | |

FOREIGN PATENT DOCUMENTS

| | | |
|---|---|---|
| CN | 1790702 A | 6/2006 |
| CN | 1860595 A | 11/2006 |
| CN | 101770865 A | 7/2010 |
| CN | 102024786 A | 4/2011 |
| CN | 103199058 A | 7/2013 |
| CN | 103730349 A | 4/2014 |
| CN | 105552035 A | 5/2016 |
| CN | 105679654 A | 6/2016 |
| CN | 106356365 A | 1/2017 |
| CN | 107665829 A | 2/2018 |
| JP | 2017050529 A | 3/2017 |

* cited by examiner

METHOD FOR FORMING LEAD WIRES IN HYBRID-BONDED SEMICONDUCTOR DEVICES

CROSS-REFERENCE TO RELATED APPLICATIONS

This application is a continuation application of U.S. patent application Ser. No. 17/009,452, filed on Sep. 1, 2020, which is a divisional application of U.S. patent application Ser. No. 16/126,935, filed on Sep. 10, 2018, which claims priority to Chinese Patent Application No. 201710732727.2, filed on Aug. 24, 2017 and PCT Patent Application No. PCT/CN2018/098508, filed on Aug. 3, 2018, which are incorporated herein by reference in their entirety.

TECHNICAL FIELD

The present disclosure generally relates to the field of semiconductor technology, and more particularly, to a method for forming a three-dimensional (3D) memory device.

BACKGROUND

Planar memory cells are scaled to smaller sizes by improving process technology, circuit design, programming algorithm, and fabrication process. However, as feature sizes of the memory cells approach a lower limit, planar process and fabrication techniques become challenging and costly. As such, memory density for planar memory cells approaches an upper limit. A three-dimensional (3D) memory architecture can address the density limitation in planar memory cells.

BRIEF SUMMARY

Embodiments of hybrid bonding semiconductor structures having lead wire structures and methods for forming the same are described in the present disclosure.

In some embodiments, a method for improving reliability of metal lead wires in a hybrid-bonded wafer structure is described. The method includes providing a substrate and forming a base dielectric layer on the top surface of the substrate. The base dielectric layer covers the top surface of the substrate. The method also includes forming metal conductive structures in the base dielectric layer. The method further includes forming an alternating dielectric layer stack on the base dielectric layer and on the embedded conductive structures. Forming the alternating dielectric layer stack includes alternatingly forming two silicon nitride layers and two silicon oxide layers. The method also includes performing a planarization process on the alternating dielectric layer stack, and forming metal lead wire trenches using respective preset etching rates for the silicon nitride and silicon oxide layers. The metal lead wire trenches expose at least portions of the top surfaces of the metal conductive structures. The method also includes filling the metal lead wire trenches with conductive material to form metal lead wires.

In some embodiments, the base dielectric layer is formed using chemical vapor deposition (CVD) processes. In some embodiments, the alternating silicon nitride and silicon oxide layers are formed using CVD processes.

In some embodiments, forming conductive structures includes etching metal lead wire trenches in the base dielectric layer according to a circuit layout design. In some embodiments, the trenches are filled with conductive material that overflows onto the top surface of the base dielectric layer. The overflown portions of the conductive material are removed such that the top surface of filled conductive material is coplanar with the top surface of the base dielectric layer.

In some embodiments, forming the alternating dielectric layer stack includes forming a first silicon nitride layer on the top surface of the base dielectric layer, and the first silicon nitride layer covers the top surface of the base dielectric layer. A first silicon oxide layer is formed and covers the top surface of the first silicon nitride layer, while a second silicon nitride layer is formed on the top surface of the first silicon oxide layer and covers the top surface of the first silicon oxide layer. A second silicon oxide layer is formed and covers the top surface of the second silicon nitride layer.

In some embodiments, the width of the metal lead wire trench is less than the width of the conductive structure.

In some embodiments, the conductive structure is formed using copper and forming the metal lead wire includes disposing copper into the metal lead wire trenches.

In some embodiments, forming metal lead wire by disposing metal material into metal lead wire trenches includes disposing metal material that fill the trenches and overflows onto the top surface of the alternating dielectric layer stack. The overflown portions of the metal material are removed such that the top surface of filled metal material is coplanar with the top surface of the alternating dielectric layer stack.

Other aspects of the present disclosure can be understood by those skilled in the art in light of the description, the claims, and the drawings of the present disclosure.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
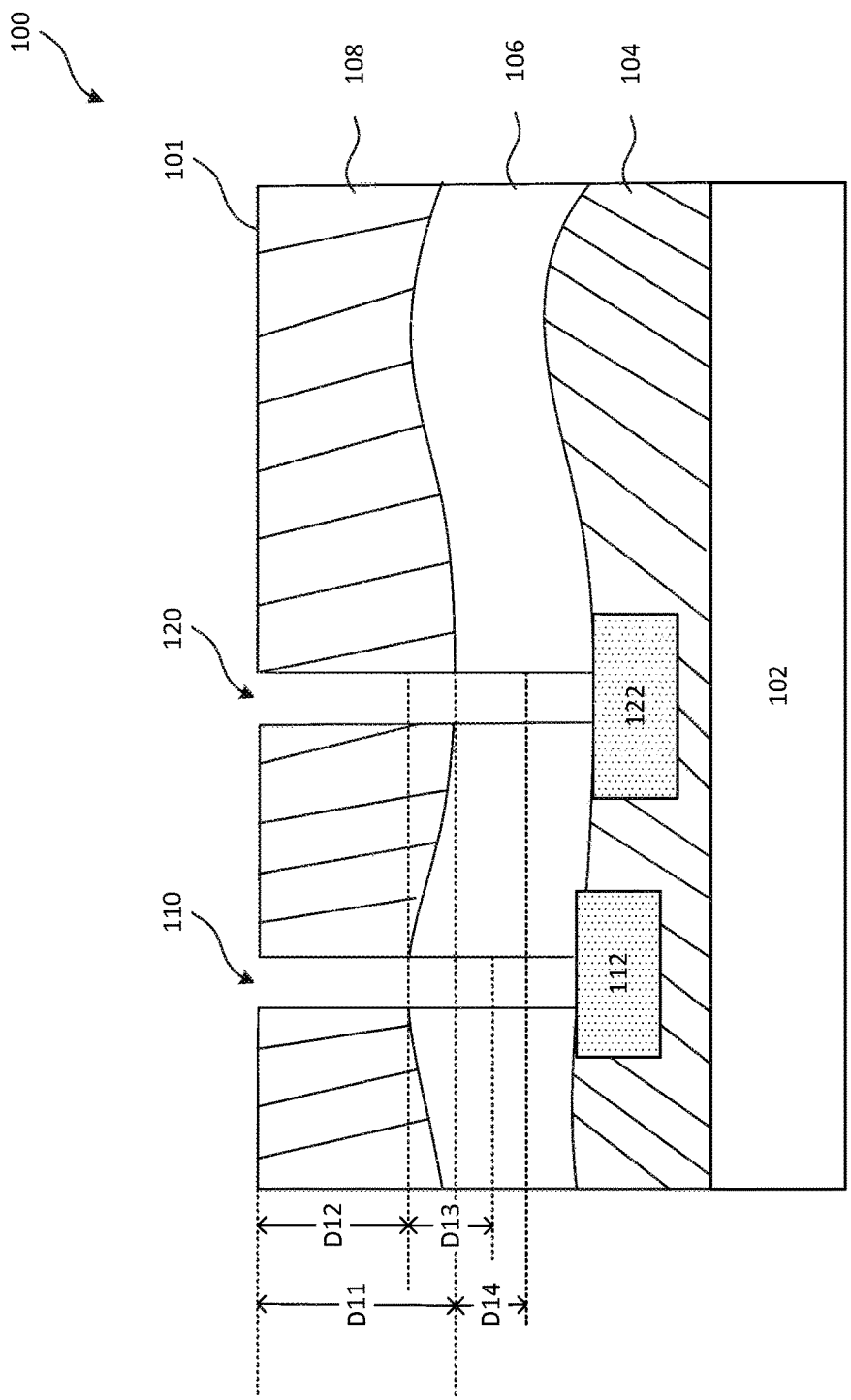
FIG. 1 illustrates a semiconductor wafer having dielectric layers and embedded conductive structures for forming lead wire structures, in accordance with some embodiments of the present disclosure.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnection layer can include one or more conductor and contact layers (in which contacts, interconnect lines, and/or vias are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically-oriented strings of memory cell transistors (i.e., region herein as "memory strings," such as NAND strings) on a laterally-oriented substrate so that the memory strings extend in the vertical direction with respect to the substrate. As used herein, the term "vertical/vertically" means nominally perpendicular to a lateral surface of a substrate.

Lead wires are conductive wires formed in semiconductor devices that are used to electrically connect two device components together. For example, a lead wire formed in a semiconductor wafer can include one end electrically and physically contacting a conductive structure embedded within the semiconductor wafer, while an opposing end of the lead wire is coplanar with a top surface of the semiconductor wafer and can be electrically connected to subsequently formed device components. Lead wires can extend vertically through layers of dielectric material and one end of the lead wire can be surrounded by dielectric layers and exposed for subsequent connection to other devices. Multiple wafers can be joined together using various bonding technologies, and lead wires from each wafer can be electrically connected to provide electrical connection between devices or wafers.

Hybrid bonding (also known as "metal/dielectric hybrid bonding") is a direct wafer bonding technology that forms chemical bonds between wafer surfaces without using intermediate layers, such as solder or adhesives. Hybrid bonding process forms metal-metal bonding and dielectric-dielectric bonding between bonded wafers. Smooth and flat contact surfaces are crucial for achieving hybrid-bonded structures with strong bonding strength because gaps or debris between wafers can cause chemical bonds to fail which in turn reduces device yield and reliability. Therefore, wafer surfaces to be joined together during the hybrid bonding processes are usually planarized to achieve a smooth and flat contact surface. Chemical mechanical polishing (CMP) processes are often used to planarize the wafer surfaces. However, dielectric layers formed on semiconductor wafers may have uneven film thicknesses and the CMP process may not result in a sufficiently uniform and flat contact surface. Therefore, the non-uniformity of the dielectric layers can cause under-etching and/or over-etching of the dielectric material during the formation of lead wires, which in turn causes low device yield and/or device failure. For example, under-etching of dielectric material can cause circuit breaks, while over-etching of dielectric material can cause premature and over exposure of conductive structure and ion bombardment during the etching process can damage surfaces of the conductive structure. In both scenarios of under-etching and over-etching of the dielectric materials, electrical connection failure can occur in the hybrid-bonded wafers.

Various embodiments in accordance with the present disclosure provide fabricating methods for forming high-yield lead wire structures in hybrid-bonded semiconductor wafers. In some embodiments, the hybrid-bonded semiconductor wafers can be used to form a three-dimensional (3D) memory device. Alternating dielectric layer stack and varying etching rates of dielectric materials are incorporated in lead wire structures to reduce the impact of non-uniform dielectric layers. Specifically, the alternating dielectric layer stack can include at least two dielectric layers formed using a first dielectric material and two dielectric layers formed using a second dielectric material. The preset etching rates for the dielectric layers in the alternating dielectric layer stack and be different or same during one or more steps of the etching process. After etching through the alternating dielectric layer stack using preset etching rates, under-etching and over-etching effects of dielectric layers can be reduced and reliable electrical connections of the lead wires are achieved. Therefore, the disclosed method can significantly improve device yield and reliability and reduce cost. It should be noted that the methods and structures described in the present disclosure can also be used in any suitable semiconductor structures such as, for example, a semiconductor interconnect structure for connecting device components from different layers.

FIG. 1 illustrates a semiconductor wafer 100 having dielectric layers and embedded conductive structures for forming lead wire structures, according to some embodiments. Semiconductor wafer 100 includes a substrate 102, base dielectric layer 104, first dielectric layer 106 formed on base dielectric layer 104, second dielectric layer 108 formed on first dielectric layer 106. In some embodiments, first dielectric layer 106 can be formed using silicon nitride material. In some embodiments, second dielectric layer 108 can be formed using silicon oxide material. First and second conductive structures 112 and 122 are embedded in base dielectric layer 104. Base dielectric layer 104 can be formed using any suitable dielectric material such as, for example, silicon oxide, silicon nitride, silicon oxynitride, and/or other suitable dielectric materials. First and second lead wire trenches 110 and 120 extend through first and second dielectric layers 106 and 108 and respectively exposes portions of first and second conductive structures 112 and 122. First and second dielectric layers 106 and 108 can have different etching rates during the etching processes that forms first and second lead wire trenches 110 and 120. For example, etching rate of second dielectric layer 108 can be about five times the etching rate of first dielectric layer 106, according to some embodiments. In some embodiments, etching rate of second dielectric layer 108 can be between 5-10 times the etching rate of first dielectric layer 106. In some embodiments, In some embodiments, the etching selectivity between first and second dielectric layer 106 and 108 can be greater than 10. Other structures can be included in semiconductor wafer 100 and are not illustrated here for simplicity. It should be noted that elements shown in FIG. 1 are for illustrative purposes and may not be drawn to scale.

First and second dielectric layers 106 and 108 can be formed by sequentially disposing respective dielectric materials. For example, a silicon nitride layer can be disposed on the top surface of base dielectric layer 104 and a silicon oxide layer can be sequentially disposed on the top surface of the silicon nitride layer. However, first and second dielectric layers 106 and 108 can have non-uniform thickness and/or surface flatness. For example, flatness of first dielectric layer 106 can be illustrated by measuring the separations between various points located on the top surface of first dielectric layer 106 and the corresponding points located on a top surface 101 of second dielectric layer 108. As shown in FIG. 1, a largest separation D11 is measured at a furthest separation between top surface of first dielectric layer 106 and top surface 101 of second dielectric layer 108, while a smallest separation D12 is measured at a closest separation between the two surfaces. In some embodiments, D11 can be about 12000 Å and D12 can be about 8000 Å. First dielectric layer 106 can be formed using silicon nitride and has a thickness about 1000 Å. In some embodiments, the etching rate of first dielectric layer 106 can be about 1 Å/5 and the etching rate of second dielectric layer 108 can be about 5 Å/5. In some embodiments, the etching rate of first dielectric layer 106 can be between about 270 Å/min and about 330 Å/min. For example, etching rate of first dielectric layer 106 can be about 300 Å/min. In some embodiments, the etching rate of second dielectric layer 108 can be between about 2700 Å/min and about 3300 Å/min. For example, etching rate of second dielectric layer 108 can be about 3000 Å/min.

To form lead wire structures, first and second lead wire trenches 110 and 120 are formed in first and second dielectric layers 106 and 108 by patterning and etching the dielectric layers and subsequently filling the trenches by conductive material. In some embodiments, the etching processes can be performed by any suitable etching processes such as, for example, a plasma etching process, a wet chemical etching process, other suitable etching processes, and/or combinations thereof. However, due to non-uniformity of first and second dielectric layers 106 and 108, under-etching and/or over-etching of the dielectric layers can occur, which may lead to over exposure of the underlying first and second conductive structures 112 and/or 122, as explained in detail below.

For illustrative purposes, the etching process that forms first and second lead wire trenches 110 and 120 can be divided into three etching steps. In the first etching step, openings are etched in second dielectric layer 108 with a depth of D12. Since the etching process only etches second dielectric layer 108 during the first etching step, the etched depths are substantially similar between first and second lead wire trenches 110 and 120. In the second etching step, first dielectric layer 106 has started to being etched in first lead wire trench 110 while in second lead wire trench 120 the remaining second dielectric layer 108 is being etched until the underlying first dielectric layer 106 is exposed. Therefore, the duration of the second etching step is determined by the depth and etching rate of the remaining second dielectric layer 108 in second lead wire trench 120. As shown in FIG. 1, the remaining second dielectric layer 108 has a depth that equals to D11-D12=12000 Å-8000 Å=4000 Å. Based on the etch rate of about 5 Å/s for second dielectric layer 108, it can be determined that the second etching process lasts for a time period of about 800 s (determined by 4000 Å/5 Å/s). During the second etching step, first dielectric layer 106 is also being etched for 800 s with an etched depth D13=800 s*1 Å/s=800 Å. After the second etching step, the remaining first dielectric layer 106 in first lead wire trench 110 has a depth of 200 Å (determined by 1000 Å-800 Å). Since the second etching step stops when first dielectric layer 106 is exposed in second lead wire trench 120, the remaining thickness of first dielectric layer 106 in second lead wire trench 120 equals to the thickness of first dielectric layer 106 that is about 1000 Å. Therefore, at the end of the second etching step, portions of first dielectric layer 106 that remains in first and second lead wire trenches 110 and 120 are 200 Å and 1000 Å, respectively. In the third etching step, the remaining portions of first dielectric layer 106 in first and second lead wire trenches 110 and 120 are removed using substantially similar etching rates (e.g., 1 Å/s). After the portion of first dielectric layer 106 (having depth of about 200 Å) is removed from first lead wire trench 110 to expose portions of underlying first conductive structure 112, portions of first dielectric layer 106 having a depth of about 800 Å remain in second lead wire trench 120. Therefore, the third etching step continues until first dielectric layer 106 is completely removed from second lead wire trench 120 such that at least portions of the top surface of second conductive structure 122 are exposed. However, during this process of removing 800 Å of first dielectric layer 106 in second lead wire trench 120, the lengthy etching process on the exposed first conductive structure 112 can cause undesirable effects. If a plasma etching process is used, ions in the plasma etching process will continue to bombard the exposed portions of first conductive structure 112 that can result in high surface roughness, which in turn can cause circuit breaks and/or high contact resistance in the subsequently formed lead wire. Similarly, if a wet chemical etching process is used, chemicals in the chemical solution will continue to etch away exposed surfaces of first conductive structure 112, also causing high surface roughness. Therefore, there is a need to shorten the time period when first conductive structure 112 is exposed under the etching process while dielectric material is being removed to expose second conductive structure 122.

Figure 10:
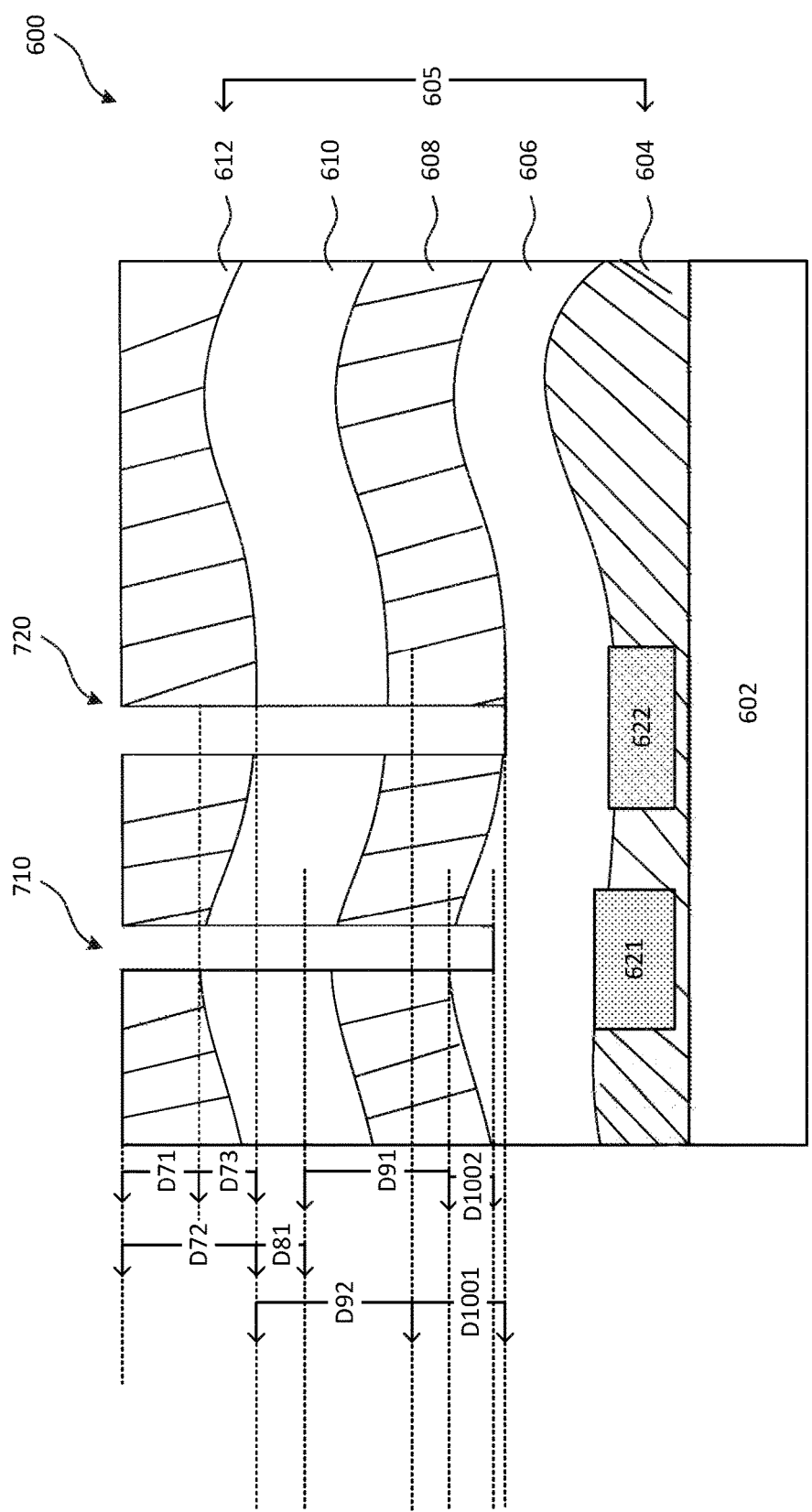
Figure 11:
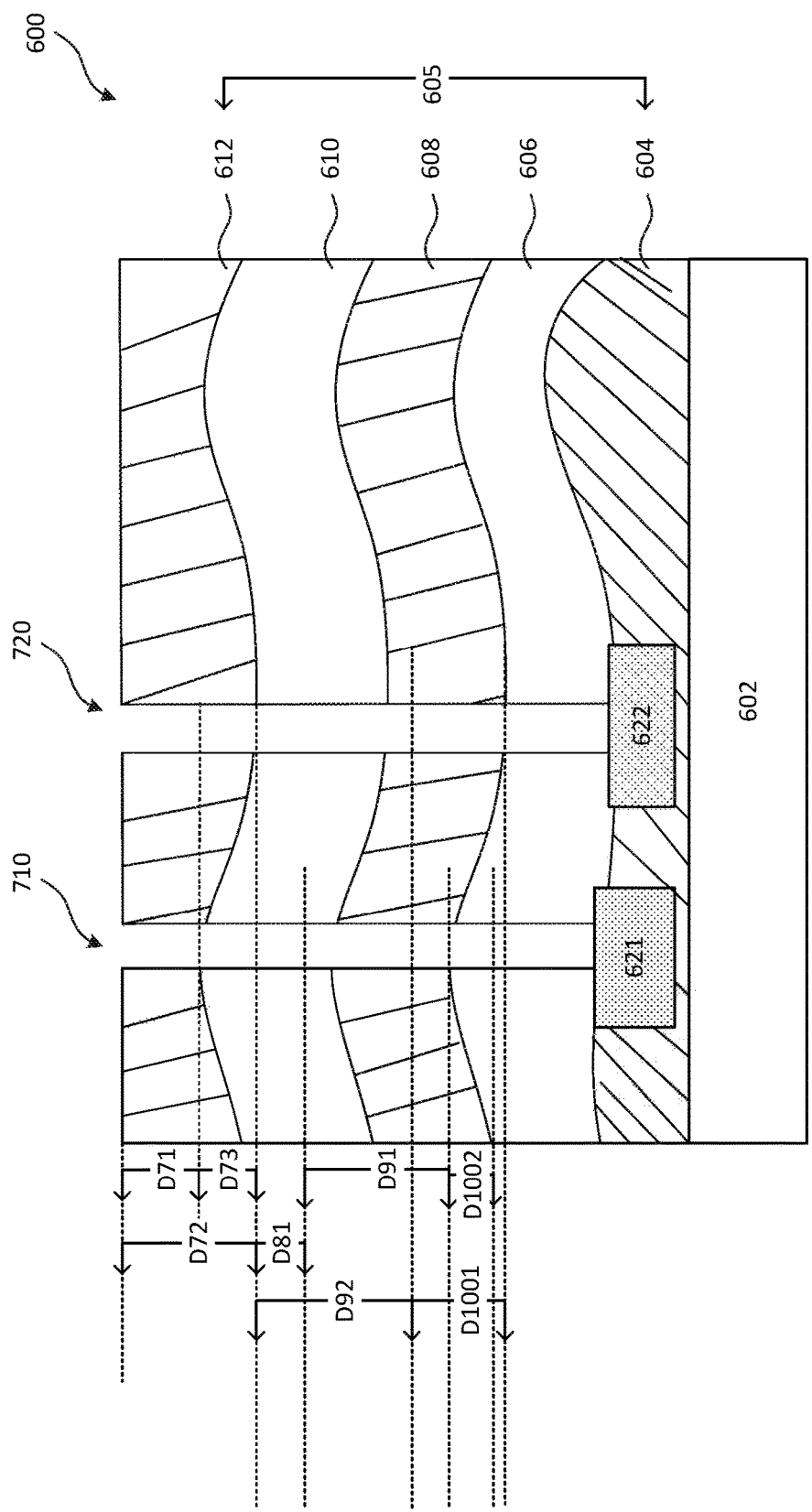
Figure 12:
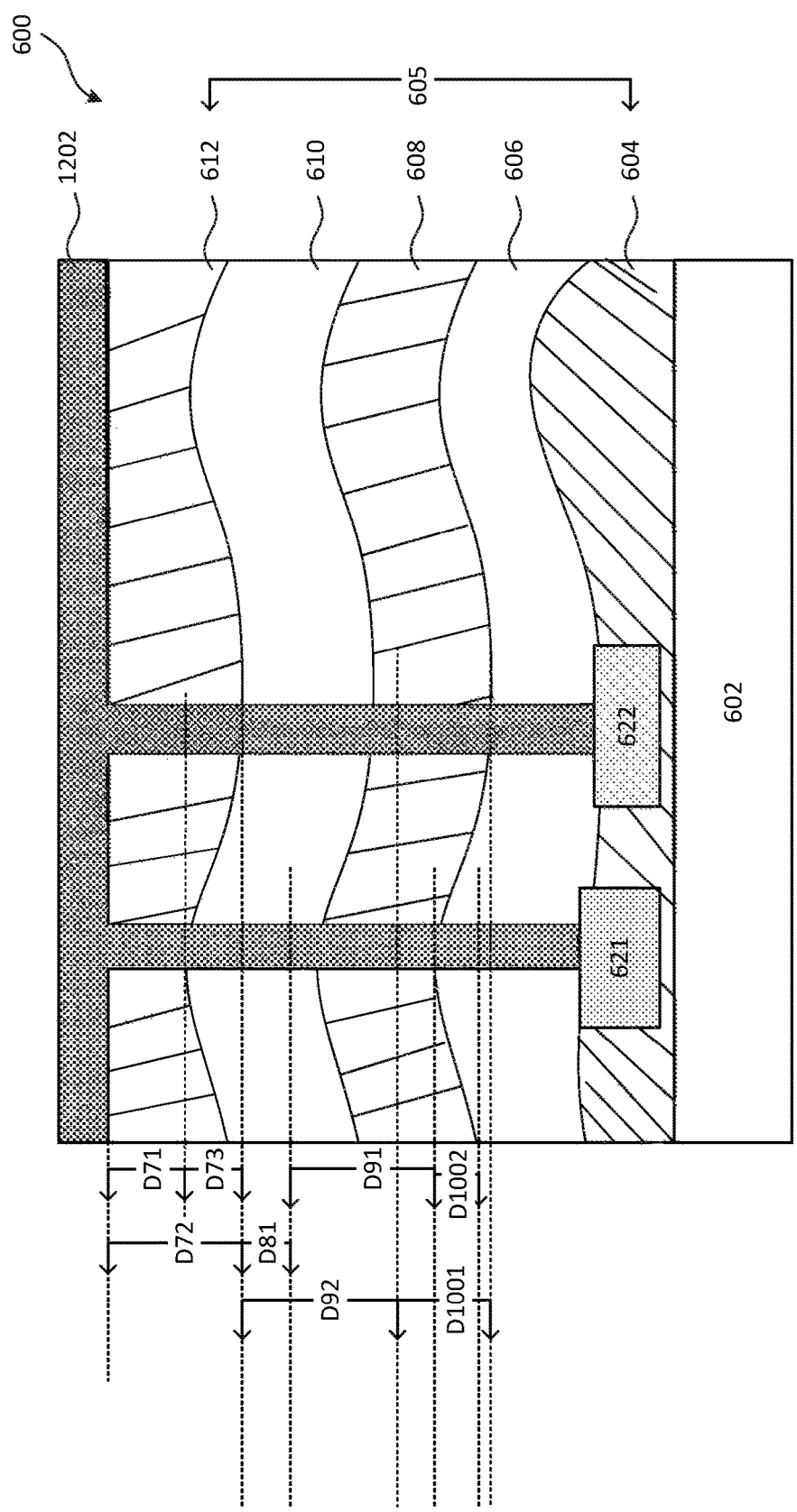
Figure 13:
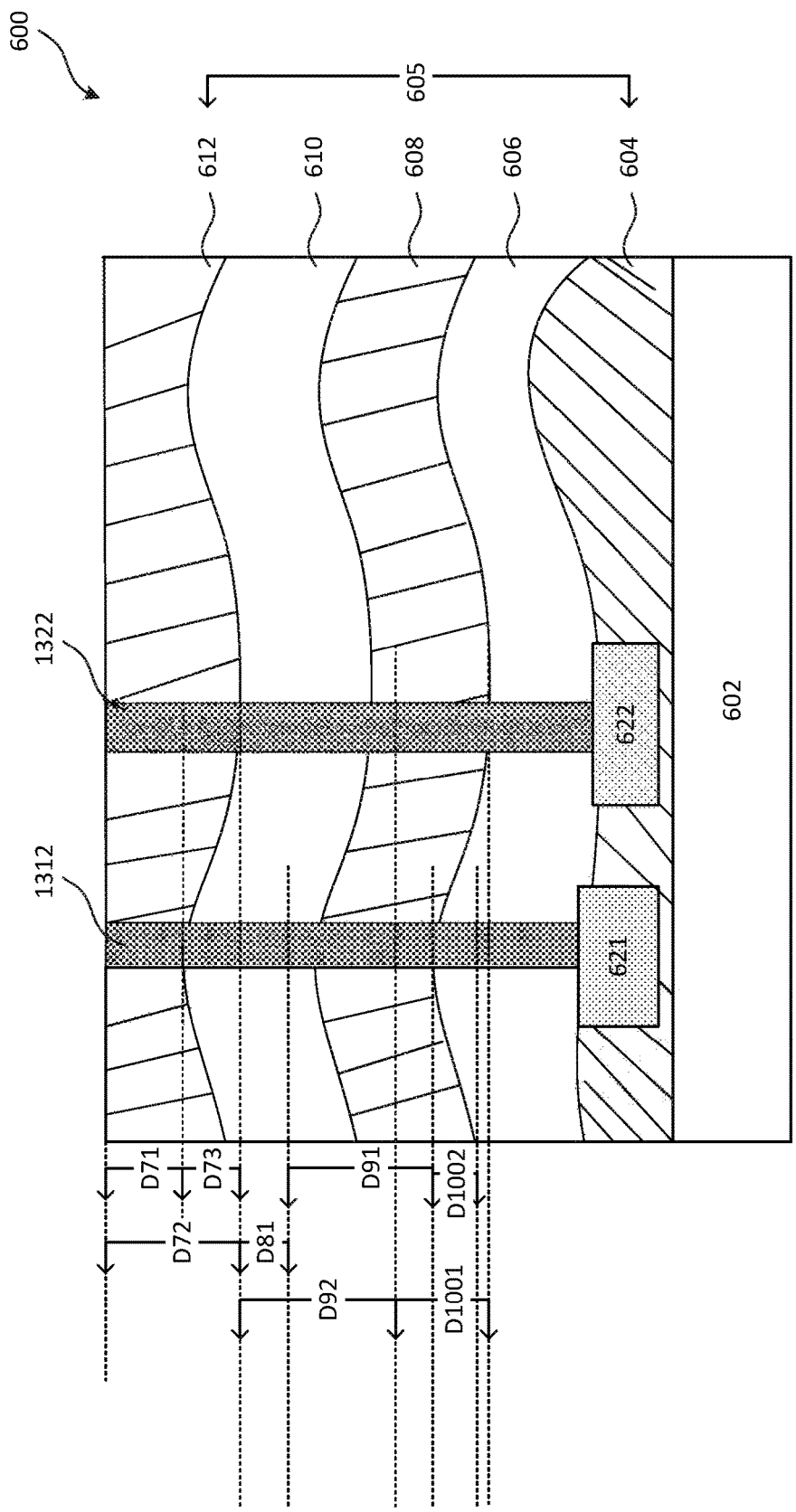
Figure 14:
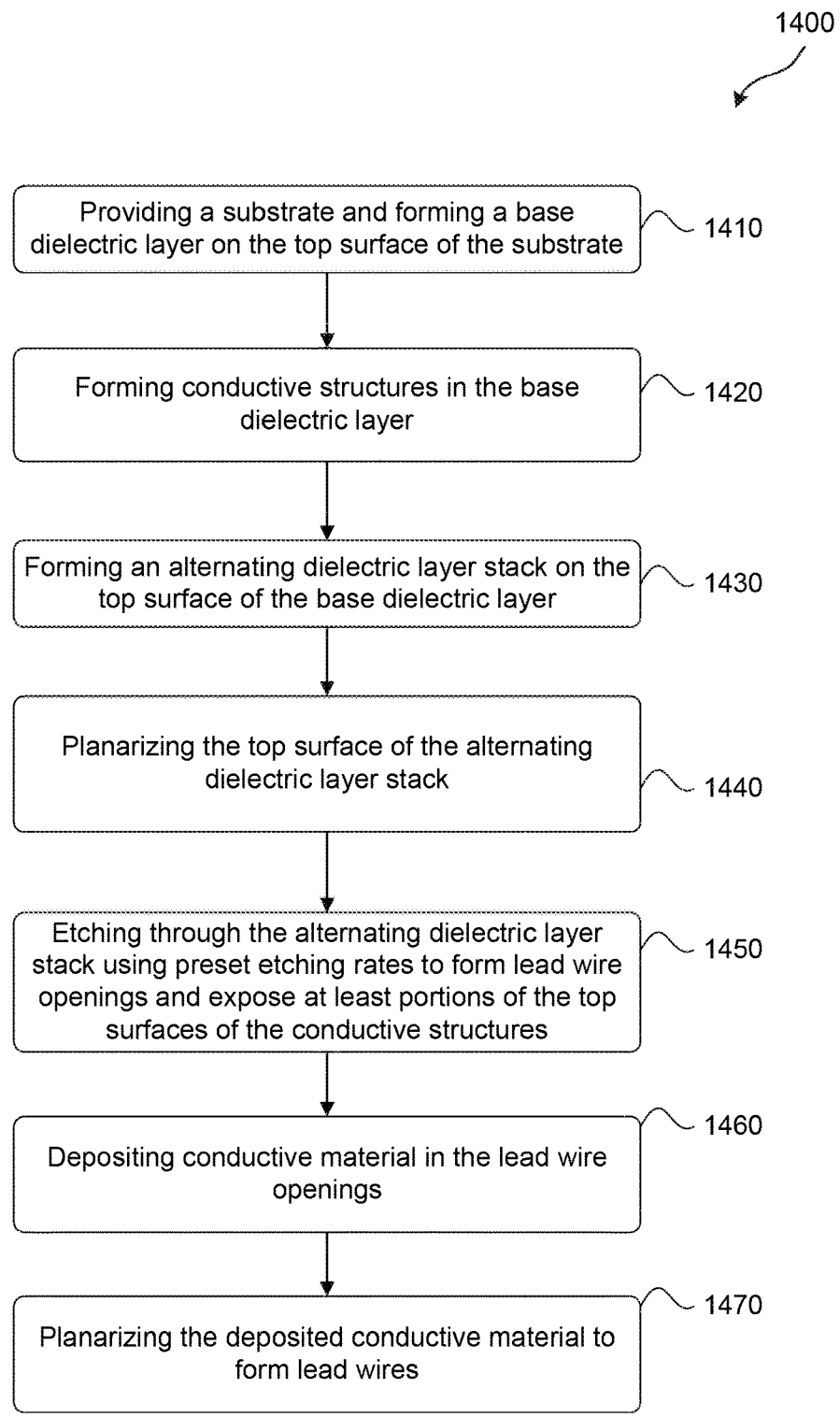
FIGS. 14-15 are flow diagrams illustrating exemplary methods for forming hybrid bonding structures with improved lead wire structures, in accordance with some embodiments of the present disclosure.
Figure 15:
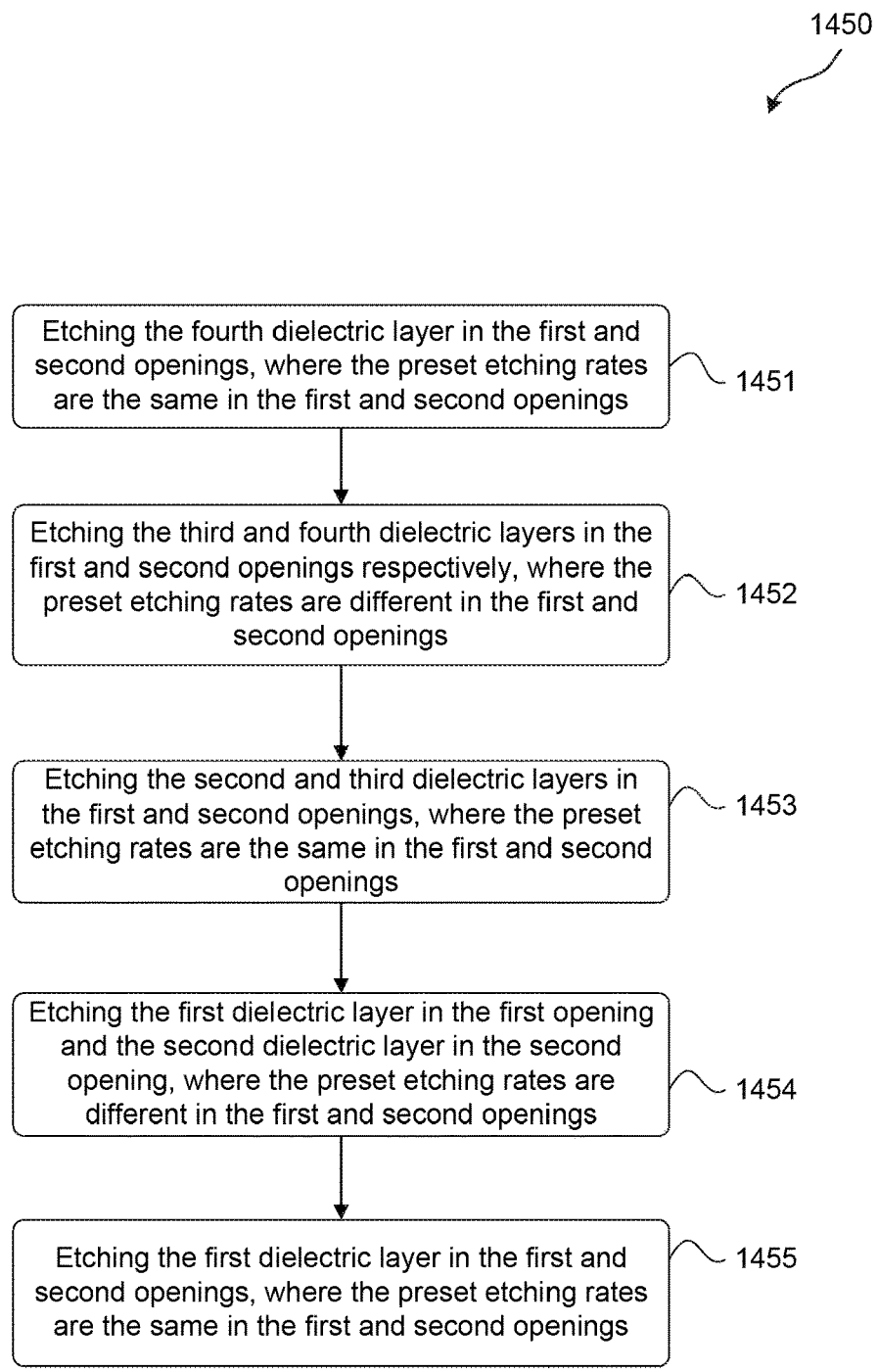

FIGS. 2-13 illustrate exemplary fabrication processes for forming hybrid bonding structures with improved lead wire structures, according to some embodiments. Specifically, FIGS. 2-5 illustrate an exemplary fabrication process for forming conductive structures in a base dielectric layer, FIGS. 6-11 illustrate an exemplary fabrication process for forming lead wire trenches in the alternating dielectric layer stack, and FIGS. 12-13 illustrate forming lead wire structures in the lead wire trenches, according to some embodiments. FIGS. 14-15 describe flow diagrams illustrating exemplary methods for forming hybrid bonding structures with improved lead wire structures. For simplicity purposes, FIGS. 2-13 are described with reference to the method described in FIGS. 14 and 15. Based on the disclosure herein, operations in method 1400 of FIG. 14 can be performed in a different order and/or vary. Other operations may be included in method 1400 and are not shown for simplicity.

Figure 2:
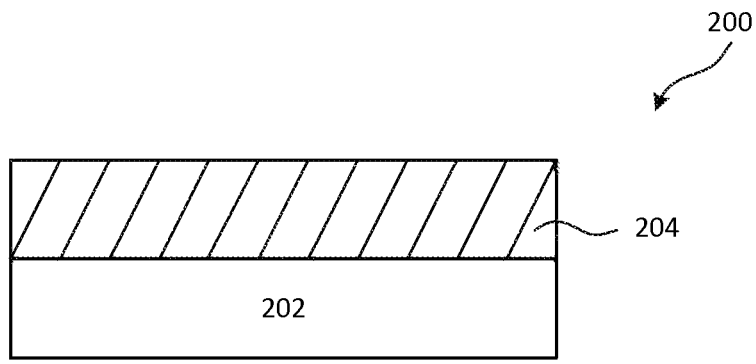
FIGS. 2-13 illustrates exemplary fabrication processes for forming hybrid bonding structures with improved lead wire structures, in accordance with some embodiments of the present disclosure.

As shown in FIGS. 2 and 14, method 1400 begins with operation 1410 by providing substrate 202 and forming base dielectric layer 204 on a top surface of substrate 202, according to some embodiments. In some embodiments, substrate 202 can include any suitable material for forming a three-dimensional memory structure. In some embodiments, substrate 202 can include silicon, silicon germanium, silicon carbide, silicon on insulator (SOI), germanium on insulator (GOI), glass, gallium nitride, gallium arsenide, any suitable III-V compound material, and/or combinations thereof. Base dielectric layer 204 can be formed using any suitable dielectric material such as, for example, silicon oxide, silicon nitride, silicon oxynitride, and/or other suitable dielectric materials. The deposition of base dielectric layer 204 can include any suitable methods such as chemical vapor deposition (CVD), physical vapor deposition (PVD), plasma-enhanced CVD (PECVD), sputtering, metal-organic chemical vapor deposition (MOCVD), atomic layer deposition (ALD), and/or combinations thereof.

Figure 3:
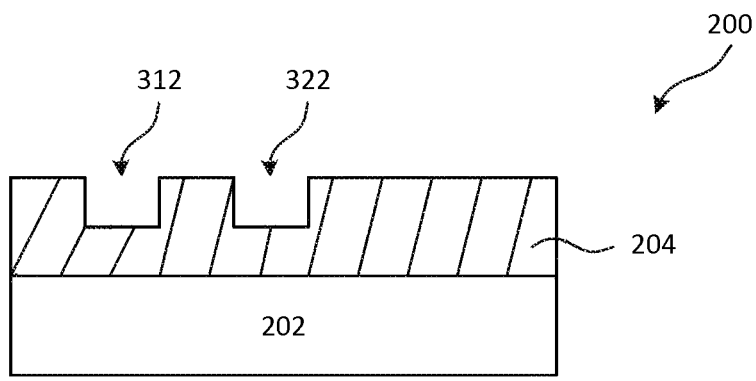
Figure 4:
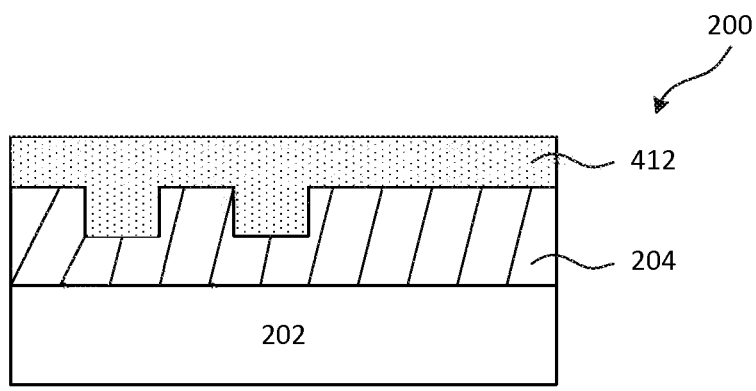
Figure 5:
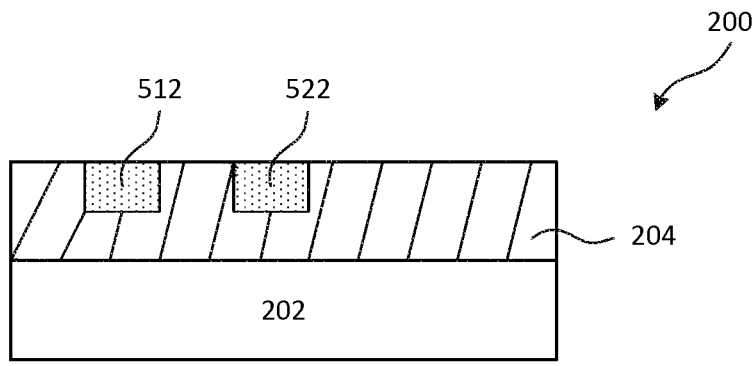

As shown in FIGS. 3-5, method 1400 continues with operation 1420 by forming conductive structures in the base dielectric layer, according to some embodiments. FIG. 3 illustrates the partially-fabricated semiconductor wafer 200 after trenches are formed in the base dielectric layer, according to some embodiments. As shown in FIG. 3, first and second trenches 312 and 322 are formed in base dielectric layer 204. Widths of first and second trenches 312 and 322 can determine the widths of subsequently formed conductive structures. First and second trenches 312 and 322 can be formed by etching trenches in based dielectric layer 204 based on circuit layout design that are imprinted on photolithography masks. First and second trenches 312 and 322 can be formed by forming a mask layer over base dielectric layer 204 and patterning the mask using, e.g., photolithography processes, to form openings corresponding to the trenches in the patterned mask layer. Suitable etching processes, e.g., dry etch and/or wet etch, can be performed to remove portions of base dielectric layer 204 exposed by the openings until a nominal trench depth is reached. The etching processes can be plasma processes such as, for example, a reactive ion etching (RIE) process using oxygen-based plasma. In some embodiments, the RIE etching process may include etchant gas such as, for example, $CF_4$, $SF_6$, $CHF_3$, and/or other suitable gases. Numerous other etching methods can also be suitable. The mask layer can be removed after the formation of first and second trenches 312 and 322.

FIG. 4 illustrates the partially-fabricated semiconductor wafer 200 after trenches are filled with conductive material, according to some embodiments. As shown in FIG. 4, a conductive layer 412 is disposed to fill first and second trenches 312 and 322. In some embodiments, conductive layer 412 overflows onto the top surface of base dielectric layer 204 after completely filling first and second trenches 312 and 322. Conductive layer 412 can be formed using any suitable conductive material such as, for example, tungsten, aluminum, silver, copper, and/or combinations thereof. Conductive layer 412 can include conductor materials disposed by one or more thin film deposition processes including, but not limited to, CVD, PVD, ALD, electroplating, electroless plating, or any combinations thereof. Fabrication processes to form conductive layer 412 can also include photolithography, CMP, wet/dry etch, or any combination thereof.

FIG. 5 illustrates the partially-fabricated semiconductor wafer 200 after a planarization process, according to some embodiments. As shown in FIG. 5, conductive layer 412 is thinned down and planarized such that first and second conductive structures 512 and 522 are formed in base dielectric layer 204. The thin down process can include any suitable etching process such as, for example, a plasma etching process, a wet chemical etching process, and/or combinations thereof. In some embodiments, a planarization process can be used to thin down and planarize conductive layer 412 such that after planarization the remaining conductive layer 412 forms first and second conductive structures 512 and 522, and that top surfaces of first and second conductive structures 512 and 522 are coplanar with the top surface of base dielectric layer 204.

Figure 6:
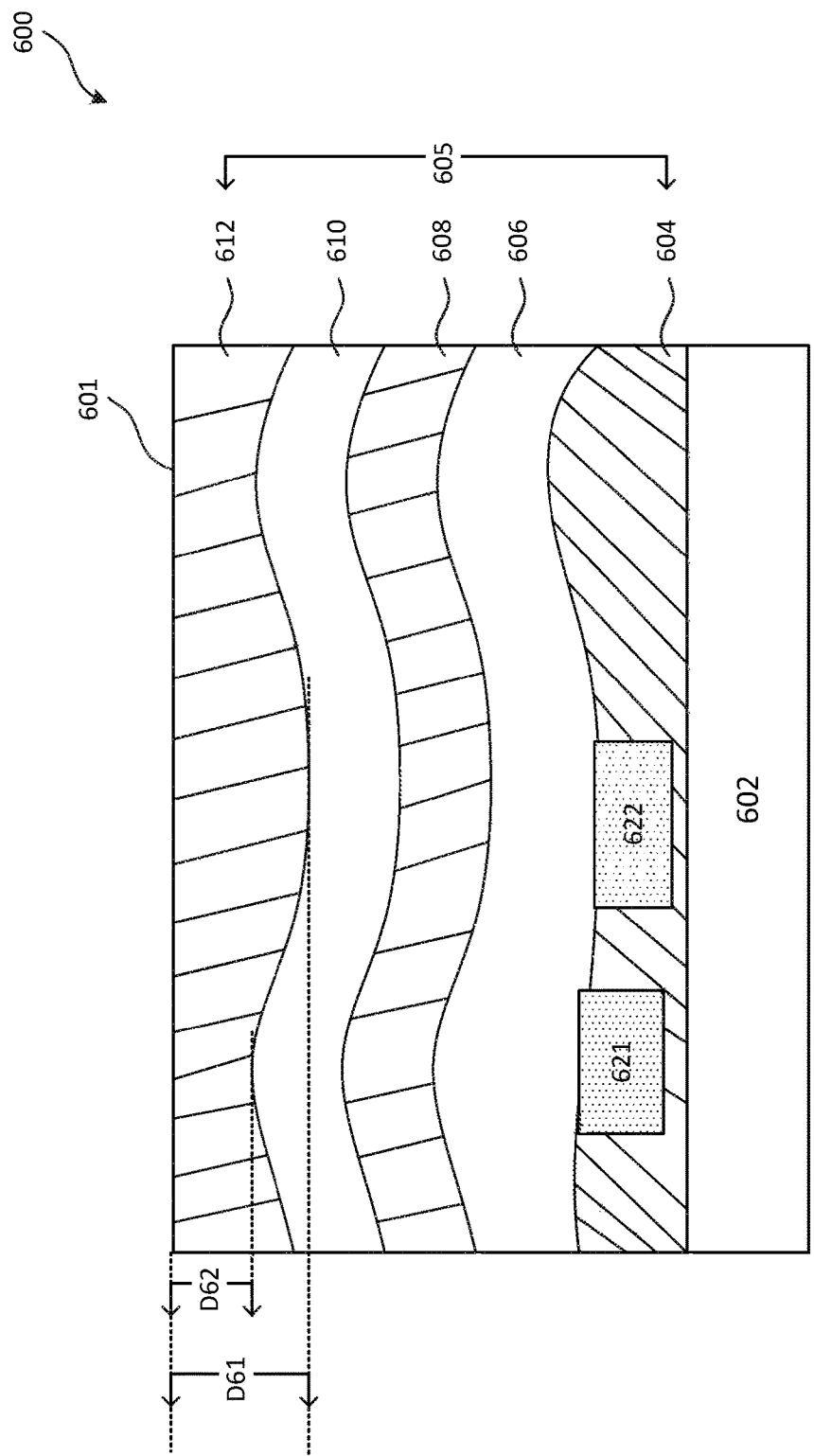

As shown in FIGS. 6 and 14, method 1400 continues with operation 1430 by forming an alternating dielectric layer stack on the top surface of the base dielectric layer, according to some embodiments. FIG. 6 illustrates a semiconductor wafer 600 having an alternating dielectric layer stack and embedded conductive structures for forming lead wire structures. Semiconductor wafer 600 includes substrate 602, base dielectric layer 604, and alternating dielectric layer stack 605 formed on base dielectric layer 604. Alternating dielectric layer stack 605 can include first dielectric layer 606, second dielectric layer 608, third dielectric layer 610, and fourth dielectric layer 612. In some embodiments, first dielectric layer 606 and third dielectric layer 610 can be formed using silicon nitride material and having similar etching rate. In some embodiments, second dielectric layer 608 and fourth dielectric layer 612 can be formed using silicon oxide material and having similar etching rate. First and second conductive structures 612 and 622 are embedded in base dielectric layer 604. In some embodiments, alternating dielectric layer stack 605 can further include other dielectric layers, depending on device design and needs.

First through fourth dielectric layers 606 to 612 can be formed by alternatingly disposing respective dielectric materials. For example, a silicon nitride layer can be disposed on the top surface of base dielectric layer 604 to form first dielectric layer 606. A silicon oxide layer can be sequentially disposed on the top surface of the first dielectric layer 606 to form second dielectric layer 608. Similarly, another silicon nitride layer can be disposed on the top surface of second dielectric layer 608 to form third dielectric layer 610. Further, another silicon oxide layer can be disposed on the top surface of third dielectric layer 610 to form fourth dielectric layer 612. However, the disposed dielectric layers may have non-uniform thickness and/or surface flatness. For example, flatness of third dielectric layer 610 can be illustrated by measuring the separations between various points located on the top surface of third dielectric layer 610 and corresponding points located on a top surface 601 of fourth dielectric layer 612. As an example, the respective largest and smallest separations D61 and D62 are similar to D11 and D12 described above in FIG. 1. For example, D61 can be about 12000 Å and D62 can be about 8000 Å. For illustration purposes only, each dielectric layer of alternating dielectric layer stack 605 has a thickness of about 1000 Å. In some embodiments, each dielectric layer of alternating dielectric layer stack 605 can have a thickness of between about 255 Å and 345 Å. For example, a silicon nitride dielectric layer can be about 300 Å. In some embodiments, an oxide dielectric layer can be between about 5600 Å and 8400 Å. For example, an oxide dielectric layer can be about 7000 Å. In some embodiments, the dielectric layers of alternating dielectric layer stack 605 can have any other suitable thicknesses depending on device design, needs, and fabrication variation. Further, silicon nitride and silicon oxide dielectric layers can have same or different preset etching rates to achieve similar or different etching selectivities. For example, silicon nitride etching rate can be about 1 Å/s and silicon oxide etching rate can be about 5 Å/s. In some embodiments, silicon nitride and silicon oxide etching rate can be adjusted to be about the same (e.g., about 1 Å/s).

Method 1400 continues with operation 1440 by planarizing the top surface of the alternating dielectric layer stack, according to some embodiments. In some embodiments, the planarization process can be a CMP process.

Method 1400 continues with operation 1450 by etching through the alternating dielectric layer stack using preset etching rates to form lead wire openings and expose at least portions of the top surfaces of the conductive structures, according to some embodiments. To form lead wire structures, first and second lead wire trenches are formed through alternating dielectric layer stack 605 by patterning and etching the dielectric layers and subsequently filling the trenches by conductive material. As further explained below with references to FIGS. 7-11, the incorporation of alternating dielectric layer stack 605 and preset etching rates can reduce the impact of dielectric film non-uniformity and reduce under-etching and/or over-etching of the dielectric layers. As a result, over exposure of the underlying conductive structures can be minimized, which in turn leads to improved device yield and reliability. For illustrative purposes, the etching process in operation 1450 of method 1400 that forms lead wire trenches in semiconductor wafer 600 can be divided into five etching steps, described respectively in FIGS. 7-11 and with reference to FIG. 15.

Figure 7:
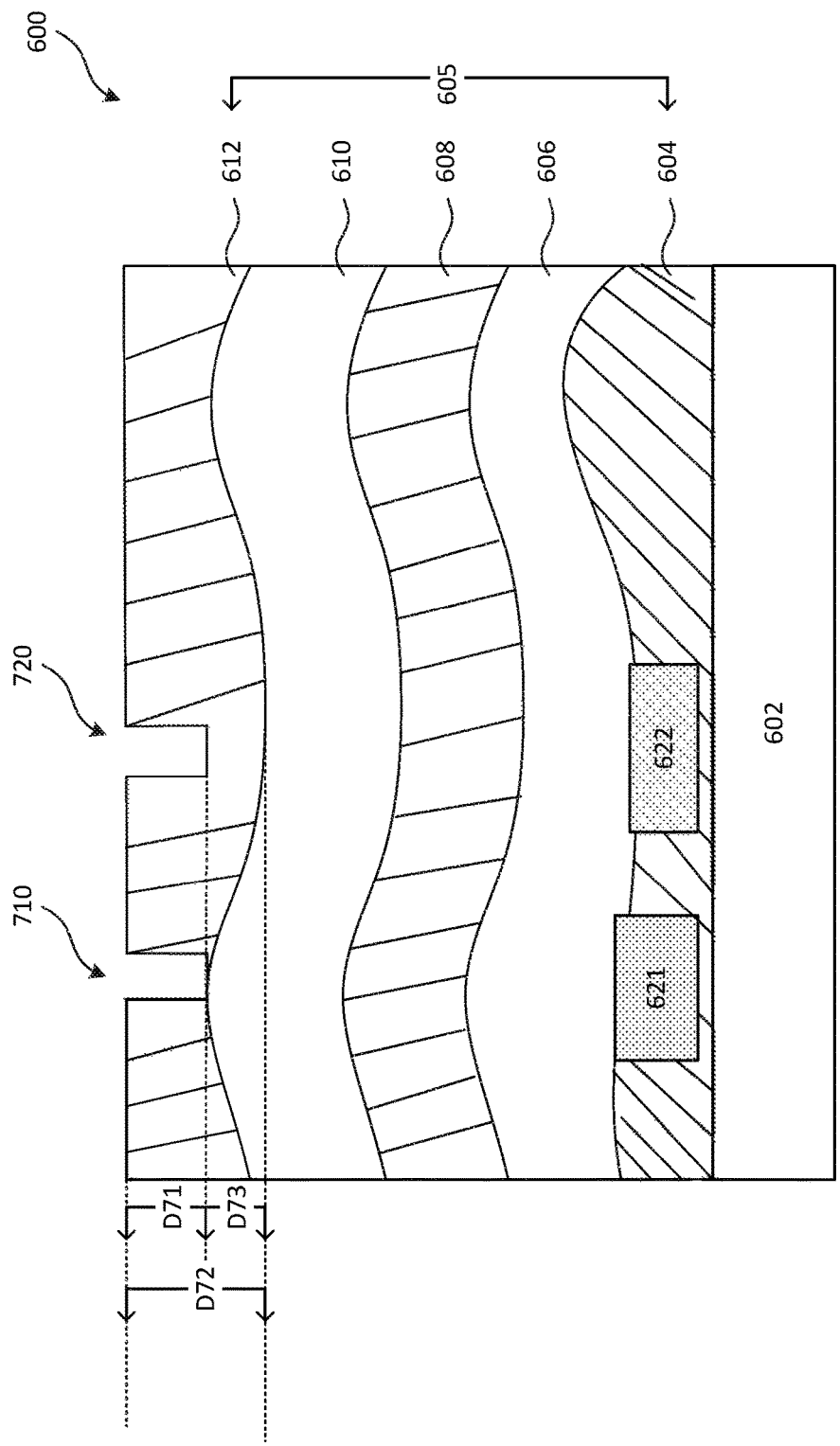

As illustrated in FIGS. 7 and 15, method 1400 continues with operation 1451 where the first etching step includes forming first and second openings 710 and 720 in fourth dielectric layer 612 until third dielectric layer 610 is exposed in first opening 710, according to some embodiments. In some embodiments, more openings can be formed and are not illustrated for simplicity. In some embodiments, first and second openings 710 and 720 can be lead wire trenches. In some embodiments, first and second openings 710 and 720 can be openings for forming interconnect structures. In some embodiments, the flatness variation of films can cause height variations across the wafer. For example, similar to depths D11 and D12 described in FIG. 1, depth D71 and D72 can be about 8000 Å and 12000 Å respectively. Since the etching process only etches fourth dielectric layer 612 during the first etching step, the etched depths of the openings are substantially similar between first and second openings 710 and 720. First and second openings can be formed using suitable processes, including patterning and etch processes. The patterning process can include forming a photoresist layer overlying fourth dielectric layer 612, exposing the photoresist layer to a pattern, performing post-exposure bake processes, and developing the photoresist layer to form a masking element including the resist. The masking element can protect regions of fourth dielectric layer 612, while etch processes are used to remove dielectric material and form openings in fourth dielectric layer and underlying layers. The etching process can be a reactive ion etch (RIE) process and/or other suitable process. The etching process can continue until third dielectric layer 610 is exposed, according to some embodiments. As shown in FIG. 7, due to film non-uniformity, third dielectric layer is exposed in first opening 710 while it is still being buried under fourth dielectric layer 612 in second opening 720. In some embodiments, the portion of fourth dielectric layer 612 remaining over third dielectric layer 610 in second opening 720 can have a depth D73=D72−D71=12000 Å−8000 Å=4000 Å.

Figure 8:
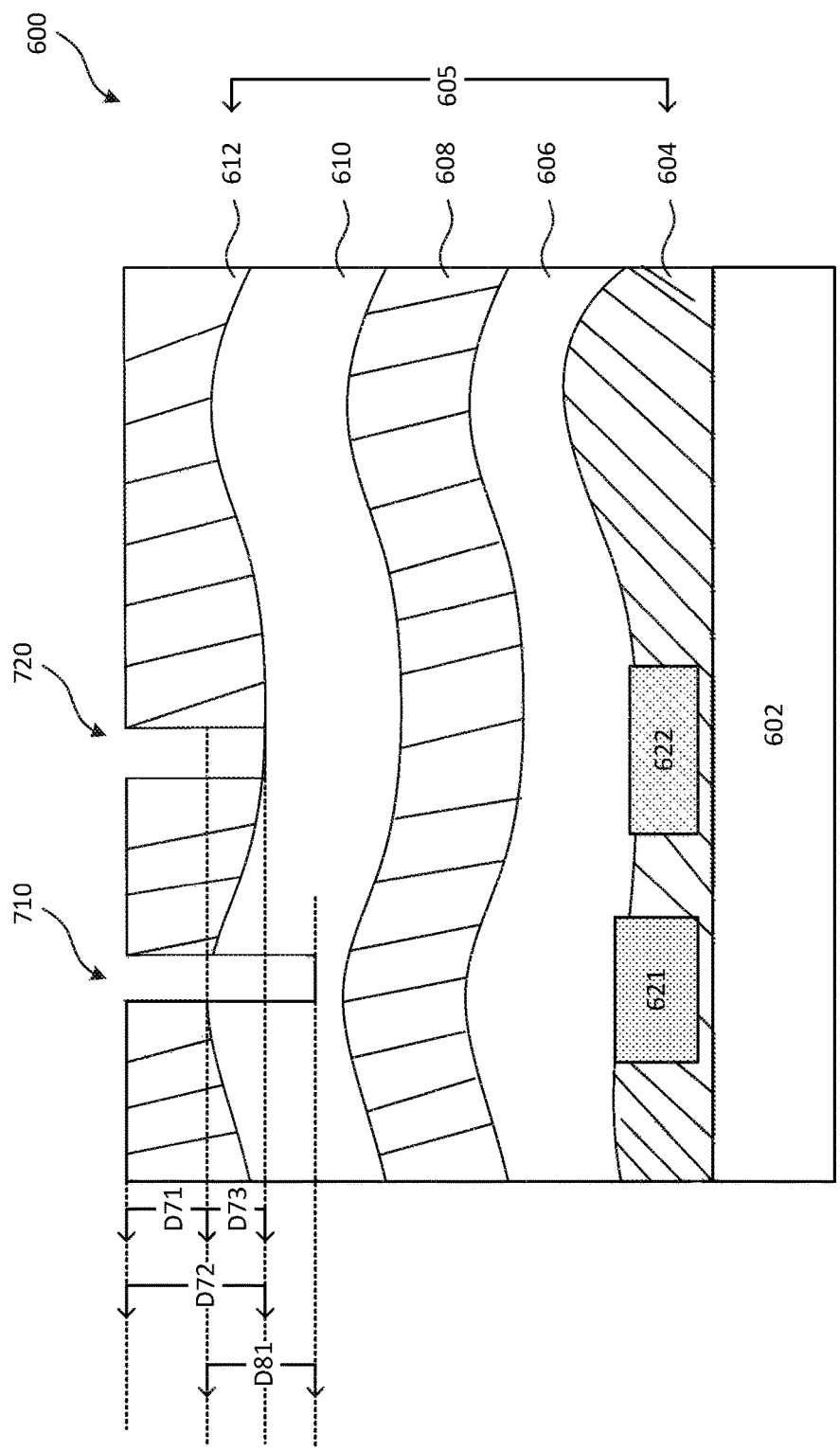

As illustrated in FIGS. 8 and 15, method 1400 continues with operation 1452 where the second etching step includes further etching the alternating dielectric layer stack 605 to increase the depth of first and second openings 710 and 720 until third dielectric layer 610 is exposed in second opening 720, according to some embodiments. In the second etching step, third dielectric layer 610 has started to being etched in first opening 710 while in second opening 720 the remaining fourth dielectric layer 612 is being etched until the underlying third dielectric layer 610 is exposed. Therefore, the duration of the second etching step is determined by the depth and etching rate of the remaining fourth dielectric layer 612 in second opening 720. As discussed above, the remaining fourth dielectric layer 612 has a depth about 4000 Å. In some embodiments, fourth dielectric layer 612 can be formed using silicon oxide. During the second etching step, the preset etching rate can be set to high etch selectivity between different materials, for example, a high etch rate for silicon oxide material (e.g., 5 Å/s) can be set for fourth dielectric layer 612 and a low etch rate for silicon nitride material (e.g., 1 Å/s) can be set for third dielectric layer 610. Therefore, based on the etch rate of about 5 Å/s for fourth dielectric layer 612, it can be determined that the second etching process lasts for a time period of about 800 s (determined by 4000 Å/5 Å/s). During the second etching step, third dielectric layer 610 is also being etched for 800 s with an etched depth D81=800 s*1 Å/s=800 Å in first opening 710. After the second etching step, the remaining third dielectric layer 610 in first opening 710 has a remaining thickness of 200 Å (determined by film thickness minus etched thickness, e.g., 1000 Å−800 Å). Since the second etching step stops when third dielectric layer 610 is exposed in second opening 720, the remaining thickness of third dielectric layer 610 in second opening 720 equals to the thickness of third dielectric layer 610. Therefore, at the end of the second etching step, portions of third dielectric layer 610 that remains in first and second openings 710 and 720 are 200 Å and 1000 Å, respectively.

Figure 9:
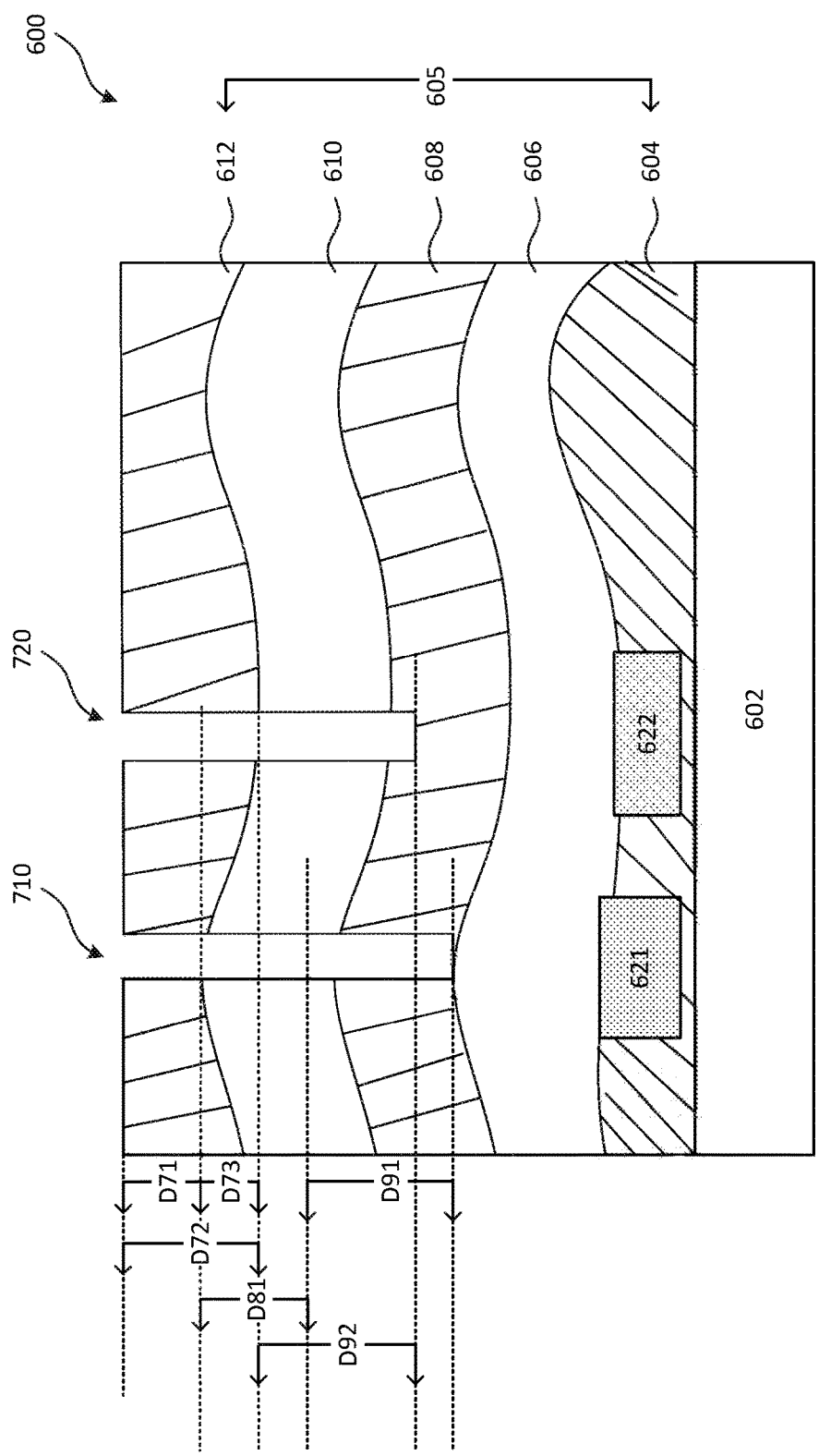

As illustrated in FIGS. 9 and 15, method 1400 continues with operation 1453 where the third etching step includes further etching the alternating dielectric layer stack 605 to increase the depth of first and second openings 710 and 720 until first dielectric layer 606 is exposed in first opening 710, according to some embodiments. In the third etching step, the remaining portions of third dielectric layer 610 in first and second openings 710 and 720 are removed and the etching process continues to etch second dielectric layer 608 in both openings. During the third etching step, the preset etching rate can be set to low etch selectivity between different materials, for example, substantially same etching rates (e.g., 1 Å/s) can be used for both second and third dielectric layers 608 and 610. As a result, respective etching depths D91 and D92 for openings 710 and 720 during the third etching step can be substantially the same by adjusting suitable etching parameters of the etching process. For example, plasma power, etchant gas type and/or gas flow rate, chamber pressure, processing temperature, and any other suitable etching parameters can be adjusted to achieve similar etching rates for different dielectric materials. The third etching step continues until first dielectric layer 606 is exposed in first opening 710. Therefore, dielectric materials removed in first opening 710 can include the remaining 200 Å of third dielectric layer 610 and the entire thickness (e.g., 1000 Å) of second dielectric layer 608, resulting in etching depths D91 of about 1200 Å. Since D92 of second opening 720 can be substantially similar to D91 due to similar etching rates, D92 can also be about 1200 Å. Since third dielectric layer 610 has a thickness of about 1000 Å, Therefore, after the third etching step, first dielectric layer 606 is exposed in first opening 710 while about 800 Å of second dielectric layer 608 remains over first dielectric layer 606 in second opening 720.

As illustrated in FIGS. 10 and 15, method 1400 continues with operation 1454 where the fourth etching step includes further etching the alternating dielectric layer stack 605 to increase the depth of first and second openings 710 and 720 until first dielectric layer 606 is exposed in second opening 720, according to some embodiments. As the remaining second dielectric layer 608 in second opening 720 is removed during the fourth etching step, the etching depth D1001 in second opening 720 can be about 800 Å. During the fourth etching step, the preset etching rate can be set to high etch selectivity between different materials, for example, a high etch rate for silicon oxide material (e.g., 5 Å/s) can be set for second dielectric layer 608 and a low etch rate for silicon nitride material (e.g., 1 Å/s) can be set for first dielectric layer 606. Therefore, based on the etch rate of about 5 Å/s for second dielectric layer 608, it can be determined that the fourth etching process lasts for a time period of about 160 s (determined by 800 Å/5 Å/s). During the fourth etching step, first dielectric layer 606 is being etched for 160 s for an etched depth of D1002=160 s*1 Å/s=160 Å in first opening 710. The fourth etching step continues until first dielectric layer 606 is exposed in second opening 720. Therefore, after the fourth etching step, the thickness difference of remaining first dielectric layer 606 in first and second openings can be merely 160 Å. Compared with the thickness difference of 800 Å of remaining first dielectric layer 106 in first and second lead wire trenches 110 and 120 described above in FIG. 1, the thickness differences have been significantly reduced. After the fourth etching step, remaining thicknesses of first dielectric layer 606 in first and second openings 710 and 720 are respectively 840 Å (e.g., original film thickness 1000 Å minus D1002 of 160 Å) and 1000 Å (e.g., original film thickness of 1000 Å).

As illustrated in FIGS. 11 and 15, method 1400 continues with operation 1455 where the fifth etching step includes further etching the alternating dielectric layer stack 605 to increase the depth of first and second openings 710 and 720 until both underlying conductive structures are exposed, according to some embodiments. In the fifth etching step, the remaining portions of first dielectric layer 606 in first and second openings are removed using substantially similar etching rates (e.g., 1 Å/s). After the portion of first dielectric layer 606 (depth of about 840 Å) is removed from first opening 710 to expose portions of underlying first conductive structure 621, portions of first dielectric layer 606 having a depth of only about 160 Å remain in second opening 720. The fifth etching step continues until first dielectric layer 606 is completely removed from second opening 720 such that at least portions of the top surface of second conductive structure 622 are exposed. The time duration to remove the remaining first dielectric layer 606 in second opening 720 can be determined by dividing the remaining thickness (1000 Å) by the etching rate of first dielectric layer 606 (1 Å/s) resulting in a time duration of about 1000 s. Similarly, the time duration to remove the remaining first dielectric layer 606 from first opening 710 can be determined by dividing the remaining thickness (840 Å) by the same etching rate of 1 Å/s resulting in a time duration of about 840 s. Therefore, after first dielectric layer 606 has been removed from first opening 710, the exposed underlying conductive structure 612 would continue to be under the etching process for an additional 160 s (determined by 1000 s-840 s) until first dielectric layer 606 is completely removed in second opening 720 and underlying conductive structure 622 is exposed. Compared to the semiconductor structure described above in FIG. 1 where first conductor structure 112 is exposed to the etching process for about 800 s, the significantly reduced exposure time of about 160 s in the process described in FIG. 10 can reduce or eliminate the undesirable effects imposed on exposed first conductive structure 621. The reduced exposure time can reduce surface roughness and contamination, which in turn can eliminate circuit breaks and reduce contact resistance in the subsequently formed lead wire.

As illustrated in FIG. 12, method 1400 continues with operation 1460 where first and second openings are filled with conductive material, according to some embodiments. As shown in FIG. 12, a conductive layer 1202 is disposed to fill first and second openings 710 and 720. In some embodiments, conductive layer 1202 overflows onto the top surface of fourth dielectric layer 612 after completely filling first and second openings 710 and 720. Conductive layer 1202 can be formed using any suitable conductive material such as, for example, tungsten, aluminum, silver, copper, and/or combinations thereof. Conductive layer 1202 can include conductor materials disposed by one or more thin film deposition processes including, but not limited to, CVD, PVD, ALD, electroplating, electroless plating, or any combinations thereof. Fabrication processes to form conductive layer 1202 can also include photolithography, CMP, wet/dry etch, or any combination thereof.

As illustrated in FIG. 13, method 1400 continues with operation 1470 where the disposed conductive material is planarized to form lead wires, according to some embodiments. Conductive layer 1202 can be thinned down and planarized such that the disposed conductive material within the formed openings are coplanar with the top surface of fourth dielectric layer 612. After the planarization process respective first and second lead wires 1312 and 1322 are formed in first and second openings 710 and 720. The thin down process can include any suitable etching process such as, for example, a plasma etching process, a wet chemical etching process, and/or combinations thereof. In some embodiments, a planarization process can be used to thin down and planarize conductive layer 1202 such that after planarization the formed first and second lead wires 1312 and 1322 and the top surface of fourth dielectric layer 612 are coplanar. After first and second lead wires 1312 and 1322 are formed, semiconductor wafer 600 can be hybrid bonded with one or more other semiconductor wafers where the conductive structures and dielectric structures can be respectively bonded together. The hybrid bonding process and other semiconductor wafers are not illustrated for simplicity.

The hybrid-bonded semiconductor wafers formed using the methods described in the present disclosure can be used to form a 3D memory device. Alternating dielectric layer stack and varying etching rates of dielectric materials are used to form lead wire structures to reduce the impact of non-uniform dielectric layers. Specifically, the alternating dielectric layer stack can include at least two dielectric layers with a first etching rate and at least two other dielectric layers with a second etching rate, where the first and second etching rates can be different from each other. During one or more steps of the etching process, the first and second etching rates can be adjusted to be similar to each other. After etching through the alternating dielectric layer stack using preset etching rates, under-etching and over-etching effects of dielectric layers can be reduced and reliable electrical connections of the lead wires are achieved. Therefore, the disclosed method can dramatically improve device yield and reliability and reduce cost.

In some embodiments, a method for forming lead wires in a semiconductor structure is disclosed. The method includes providing a substrate and forming a base dielectric layer on the substrate. The method also includes forming first and second conductive structures in the base dielectric layer and disposing an alternating dielectric layer stack. Disposing alternating dielectric layer stack includes disposing a first dielectric layer on the base dielectric layer and the first and second conductive structures and sequentially disposing second, third, and fourth dielectric layers. The method further includes planarizing the disposed alternating dielectric layer stack and forming first and second openings by etching the alternating dielectric layer using preset etching rates for each of the first, second, third, and fourth dielectric layers. The forming the first and second openings continues until at least portions of the first and second conductive structures are exposed. The method also includes forming conductive material in the first and second openings to form lead wires.

In some embodiments, a method for forming a semiconductor structure includes forming a base dielectric layer on a substrate and forming first and second conductive structures in the base dielectric layer. The method also includes disposing a first dielectric layer on the base dielectric layer and the first and second conductive structures. The method further includes sequentially disposing second, third, and fourth dielectric layers. The method also includes: forming first and second openings by etching the fourth dielectric layer using a first etching selectivity in the first and second openings; etching the third and fourth dielectric layers in the first and second openings respectively using a second etching selectivity in the first and second openings; etching the second and third dielectric layers in the first and second openings using the first etching selectivity in the first and second openings; etching the first dielectric layer in the first opening and the second dielectric layer in the second opening using the second etching selectivity in the first and second openings; and etching the first dielectric layer in the first and second openings using the first etching selectivity in the first and second openings. The method further includes forming conductive material in the first and second openings.

In some embodiments, a method for forming a semiconductor structure includes forming a base dielectric layer on a substrate and forming first and second conductive structures in the base dielectric layer. The method also includes disposing a first dielectric layer on the base dielectric layer and the first and second conductive structures. The method further includes sequentially disposing second, third, and fourth dielectric layers. The method further includes: forming first and second openings by etching the fourth dielectric layer using same preset etching rates in the first and second openings; etching the third and fourth dielectric layers in the first and second openings respectively using different preset etching rates in the first and second openings; etching the second and third dielectric layers in the first and second openings using same preset etching rates in the first and second openings; etching the first dielectric layer in the first opening and the second dielectric layer in the second opening using different etching rates in the first and second openings; and etching the first dielectric layer in the first and second openings using same preset etching rates in the first and second openings to expose portions of the first and second conductive structures. The method further includes forming conductive material in the first and second openings and on the exposed portions of the first and second conductive structures to form lead wires.

In some embodiments, a lead wire semiconductor structure includes a substrate and a base dielectric layer on the substrate. The lead wire semiconductor structure also includes a plurality of conductive structures in the base dielectric layer and an alternating dielectric layer stack having at least two silicon oxide layers and two silicon nitride layers alternatively formed on the base dielectric layer. The lead wire semiconductor structure further includes a plurality of lead wires formed in the alternating dielectric layer stack, where each lead wire is in contact with and electrically connected to a conductive structure of the plurality of conductive structures.

The foregoing description of the specific embodiments will so fully reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A semiconductor structure, comprising:
a first conductive structure and a second conductive structure in a base dielectric layer, wherein the base dielectric layer has a non-flat top surface, and a first top surface of the first conductive structure is non-coplanar with a second top surface of the second conductive structure;
an alternating dielectric layer stack comprising a plurality of dielectric layers sequentially disposed on the base dielectric layer, wherein at least two of the plurality of dielectric layers have non-uniform thickness, wherein a first distance is between a first uppermost point on a top surface of one of the at least two of the plurality of dielectric layers and a bottom surface of the base dielectric layer along a stack direction of the alternating dielectric layer stack, wherein a second distance is between a second uppermost point on the top surface of the one of the at least two of the plurality of dielectric layers and the bottom surface of the base dielectric layer along the stack direction of the alternating dielectric layer stack, and wherein the first distance is substantially the same as the second distance; and
a first lead wire and a second lead wire formed in the alternating dielectric layer stack and electrically connected to the first conductive structure and the second conductive structure, respectively.

2. The semiconductor structure of claim 1, wherein a first cross-section of the first lead wire at an interface between two adjacent dielectric layers of the plurality of dielectric layers is non-coplanar with a second cross-section of the second lead wire at the interface, and
wherein a first cross-section of the first lead wire at an interface between the third and fourth dielectric layers and a second cross-section of the second lead wire at the interface between the third and fourth dielectric layers have an offset in a vertical direction.

3. The semiconductor structure of claim 1, wherein the plurality of dielectric layers comprise at least first, second, third, and fourth dielectric layers.

4. The semiconductor structure of claim 3, wherein the first and third dielectric layers are silicon nitride layers.

5. The semiconductor structure of claim 3, wherein the second and fourth dielectric layers are silicon oxide layers.

6. The semiconductor structure of claim 3, wherein the first conductive structure, the second conductive structure, the first lead wire, and the second lead wire comprise copper.

7. The semiconductor structure of claim 1, wherein top surfaces of the first lead wire and the second lead wire are coplanar with a top surface of the alternating dielectric layer stack.

8. The semiconductor structure of claim 1, wherein a first dimension of the first lead wire along the stack direction of the alternating dielectric layer stack is different from a second dimension of the second lead wire along the stack direction.

9. The semiconductor structure of claim 1, wherein the at least two of the plurality of dielectric layers have non-uniform surface flatness.

10. The semiconductor structure of claim 3, wherein the second and third dielectric layers have non-flat top and bottom surfaces.

11. A semiconductor structure, comprising:
a first conductive structure and a second conductive structure in a base dielectric layer;
an alternating dielectric layer stack comprising a plurality of dielectric layers sequentially disposed on the base dielectric layer, wherein at least two of the plurality of dielectric layers have non-uniform surface flatness, wherein a first distance is between a first uppermost point on a top surface of one of the at least two of the plurality of dielectric layers and a bottom surface of the base dielectric layer along a stack direction of the alternating dielectric layer stack, wherein a second distance is between a second uppermost point on the top surface of the one of the at least two of the plurality of dielectric layers and the bottom surface of the base dielectric layer along the stack direction of the alternating dielectric layer stack, and wherein the first distance is substantially the same as the second distance; and
a first lead wire and a second lead wire formed in the alternating dielectric layer stack and electrically connected to the first conductive structure and the second conductive structure, respectively, wherein a first dimension of the first lead wire along the stack direction of the alternating dielectric layer stack is different from a second dimension of the second lead wire along the stack direction.

12. The semiconductor structure of claim 11, wherein a first cross-section of the first lead wire at an interface between two adjacent dielectric layers of the plurality of dielectric layers is non-coplanar with a second cross-section of the second lead wire at the interface.

13. The semiconductor structure of claim 11, wherein the plurality of dielectric layers comprise at least first, second, third, and fourth dielectric layers.

14. The semiconductor structure of claim 13, wherein the first and third dielectric layers are silicon nitride layers.

15. The semiconductor structure of claim 13, wherein the second and fourth dielectric layers are silicon oxide layers.

16. The semiconductor structure of claim 13, wherein the first conductive structure, the second conductive structure, the first lead wire, and the second lead wire comprise copper.

17. The semiconductor structure of claim 11, wherein top surfaces of the first lead wire and the second lead wire are coplanar with a top surface of the alternating dielectric layer stack.

18. The semiconductor structure of claim 11, wherein:
the base dielectric layer has a non-flat top surface; and
a first top surface of the first conductive structure is non-coplanar with a second top surface of the second conductive structure.

19. The semiconductor structure of claim 11, wherein the at least two of the plurality of dielectric layers have non-uniform surface flatness.

20. The semiconductor structure of claim 13, wherein the second and third dielectric layers have non-flat top and bottom surfaces.

* * * * *